United States Patent
Xu et al.

(10) Patent No.: US 9,508,562 B2
(45) Date of Patent: Nov. 29, 2016

(54) SIDEWALL IMAGE TEMPLATES FOR DIRECTED SELF-ASSEMBLY MATERIALS

(71) Applicant: GLOBALFOUNDRIES Inc., Grand Cayman (KY)

(72) Inventors: Ji Xu, Watervliet, NY (US); Richard A. Farrell, Albany, NY (US); Gerard M. Schmid, Rensselaer, NY (US); Moshe E Preil, Sunnyvale, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 153 days.

(21) Appl. No.: 14/316,988

(22) Filed: Jun. 27, 2014

(65) Prior Publication Data
US 2015/0380252 A1    Dec. 31, 2015

(51) Int. Cl.
| | | |
|---|---|---|
| *H01L 21/3213* | (2006.01) | |
| *H01L 21/308* | (2006.01) | |
| *H01L 21/027* | (2006.01) | |
| *H01L 21/033* | (2006.01) | |
| *H01L 21/768* | (2006.01) | |
| *H01L 21/28* | (2006.01) | |
| *G03F 7/00* | (2006.01) | |
| *H01L 21/311* | (2006.01) | |
| *C08L 53/00* | (2006.01) | |
| *G03F 1/00* | (2012.01) | |

(52) U.S. Cl.
CPC ..... *H01L 21/32139* (2013.01); *H01L 21/0271* (2013.01); *H01L 21/0274* (2013.01); *H01L 21/0337* (2013.01); *H01L 21/28123* (2013.01); *H01L 21/308* (2013.01); *H01L 21/3081* (2013.01); *H01L 21/3086* (2013.01); *H01L 21/76816* (2013.01); *B81C 2201/0198* (2013.01); *C08L 53/00* (2013.01); *C08L 53/005* (2013.01); *G03F 1/00* (2013.01); *G03F 7/0002* (2013.01); *H01L 21/31144* (2013.01)

(58) Field of Classification Search
CPC .... C08L 53/00; C08L 53/005; G03F 7/0002; G03F 1/00; H01L 21/0337; H01L 21/3086; H01L 21/3081; H01L 21/0271; H01L 21/31144; H01L 21/0274; H01L 21/308; H01L 21/76816; B81C 2201/0198
See application file for complete search history.

(56) References Cited

U.S. PATENT DOCUMENTS

| | | | | |
|---|---|---|---|---|
| 8,853,085 | B1* | 10/2014 | Abdallah | H01L 21/3081 257/E21.035 |
| 8,859,433 | B2* | 10/2014 | Abdallah | H01L 21/0337 257/E21.024 |
| 2013/0284699 | A1* | 10/2013 | Ogihara | G03F 7/0002 216/48 |
| 2014/0287587 | A1* | 9/2014 | Lee | B81C 1/00031 438/694 |
| 2014/0346142 | A1* | 11/2014 | Chapuis | B81C 1/00388 216/51 |
| 2015/0151329 | A1* | 6/2015 | Kawanishi | G03F 1/00 427/553 |
| 2015/0235839 | A1* | 8/2015 | Coskun | H01L 21/3086 438/694 |

* cited by examiner

*Primary Examiner* — Bac Au
(74) *Attorney, Agent, or Firm* — Amerson Law Firm, PLLC

(57) ABSTRACT

In one example, a method includes forming a template having a plurality of elements above a process layer and forming spacers on sidewalls of the plurality of elements. Portions of the process layer are exposed between adjacent spacers. At least one of the plurality of elements is removed. A mask structure is formed from a directed self-assembly material over the exposed portions. The process layer is patterned using at least the mask structure as an etch mask.

20 Claims, 6 Drawing Sheets

SIDEWALL IMAGE TEMPLATES FOR DIRECTED SELF-ASSEMBLY MATERIALS

BACKGROUND OF THE INVENTION

1. Field of the Invention

The disclosed subject matter relates generally to the fabrication of semiconductor devices and, more particularly, to using sidewall image templates for directed self-assembly materials.

2. Description of the Related Art

Many technological applications require the ability to pattern precise structures with increasingly smaller pitches. Existing optical lithography is capable of high-throughput processing, but the patterning pitch of a single optical lithography step is limited. A challenge for lithography is to devise tools, materials and processes that can reliably, efficiently and quickly pattern structures with smaller dimensions, reduced pitch or varied pitches.

Directed Self-Assembly (DSA) lithography is a materials-based approach that relies on the phase separation of certain polymeric materials. A basic DSA process consists of coating a polymeric material on a substrate over a previously formed guide pattern. The guide pattern is typically formed by an optical lithography process. The polymeric self-assembly material contains two (or more) chemical components that have carefully controlled size. These so-called A and B components can be bonded together into polymer chains known as diblocks. Immediately after coating, the A and B components are relatively disordered, however, these components (A, B) can be induced to separate into distinct phases and thereby form features with a characteristic pitch that is defined by the chemical composition. By coating this polymer on a substrate with a pre-formed guide pattern, it is possible to "interpolate" the features between the elements of the guide pattern and reduce the pitch by a factor of 2-40 relative to the guide pattern.

While DSA has shown promise in creating large areas of straight line/space patterns with constant pitch, it is difficult to pattern lines of varying pitch and/or dimensions using DSA technology. Such structures are useful for semiconductor device applications.

The present application is directed to using sidewall image templates for directed self-assembly materials so as to eliminate or reduce the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming semiconductor devices. One illustrative method includes forming a template having a plurality of elements above a process layer and forming spacers on sidewalls of the plurality of elements. Portions of the process layer are exposed between adjacent spacers. At least one of the plurality of elements is removed. A mask structure is formed from a directed self-assembly material over the exposed portions of the process layer. Ultimately, the process layer is patterned using at least the mask structure as an etch mask.

Another illustrative method includes forming a template having a plurality of elements above a process layer and forming spacers on sidewalls of the plurality of elements. Portions of the process layer are exposed between adjacent spacers. A mask structure is formed from a directed self-assembly material over the exposed portions of the process layer. The process layer is then patterned using the mask structure as an etch mask to define a plurality of features. A pitch defined between at least two adjacent features is dependent on at least one of an intrinsic pitch of the directed self-assembly material, a dimension of at least one of the spacers or a dimension of at least one of the elements.

BRIEF DESCRIPTION OF THE DRAWINGS

The disclosure may be understood by reference to the following description taken in conjunction with the accompanying drawings, in which like reference numerals identify like elements, and in which.

Figure 1A:
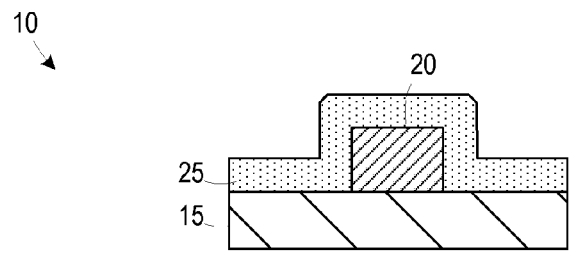
FIGS. 1A-1G are cross-sectional diagrams illustrating the patterning of a process layer using a sidewall image template and a directed self-assembly (DSA) layer.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. The present disclosure is directed to various methods of patterning of a process layer using a sidewall image template and a directed self-assembly (DSA) layer. With reference to the attached drawings various illustrative embodiments of the methods and devices disclosed herein will now be described in more detail.

FIGS. 1A-1G are cross-sectional diagrams illustrating a method for forming a semiconductor device 10 by patterning a process layer 15 using a directed self-assembly material. FIG. 1A illustrates the device 10 including a template or mandrel 20 (e.g., photoresist) formed above the process layer 15, and a spacer layer 25 formed above the template 20. The process layer 15 may be any type of material found in semiconductor processing, e.g., a metal-containing layer, a semiconductor material, a layer of insulating material, etc., and it may include a bottom anti-reflective coating (BARC) (not separately illustrated) to facilitate the photolithography patterning process to form the template 20. Exemplary processes for forming the template 20 include argon fluoride (ArF) immersion lithography, ArF dry lithography, KrF lithography, UV lithography, extreme ultraviolet (EUV) lithography, electron beam lithography, AFM-based lithography and imprint lithography. The template 20 may also be modified using resist trim dry etch or chemical shrink processes known in the art to reduce the width of the elements of the template 20 after they are formed by lithography.

Figure 1B:
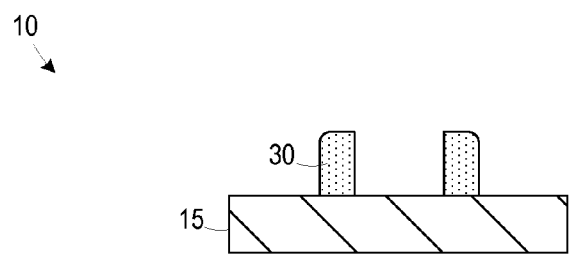

FIG. 1B illustrates the device 10 after a timed anisotropic etch process was performed on the spacer layer 25 to define spacers 30 on sidewalls of the template 20. Thereafter, an etching or ashing process was performed to remove the template 20.

Figure 1C:
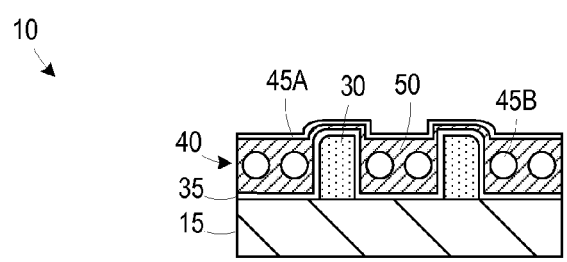

FIG. 1C illustrates the device 10 after several process operations were performed. First, a conformal brush layer 35 (e.g., polystyrene) is formed above the spacers 30. Then, a directed self-assembly (DSA) layer 40 including an inorganic component and an organic component is formed above the brush layer 35. In the illustrative example, the DSA material is a cylinder-forming, organic-inorganic block copolymer, such as polystyrene-block-polydimenthysiloxane (PS-b-PDMS), however, other DSA materials may be used. In the context of FIG. 1C, the inorganic component has separated into an inorganic component film 45A and a plurality of inorganic component cylinders 45B extending into the page. In general, the inorganic component 45A, 45B and the organic component 50 of the DSA material 40 are induced to separate into distinct phases and thereby form features with a characteristic pitch that is defined by the chemical composition. The DSA process is driven by thermodynamic instability. This phase separation can be promoted by any of several annealing processes, such as thermal annealing (baking), solvent annealing or combinations thereof. The DSA material has intrinsic phase morphology and periodicity/pitch. These properties are determined by the chemical composition of the material and can be fine-tuned by changing the chemical composition. Processes for forming the DSA materials and processing the deposited material to form the ordered pattern are known to those of ordinary skill in the art, so they are not described in greater detail herein.

Figure 1D:
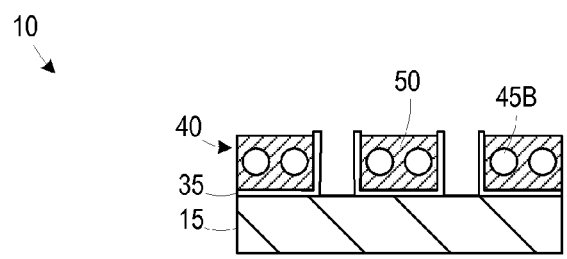

FIG. 1D illustrates the device 10 after several additional process operations were performed. First, the inorganic component film 45A and a top portion of the organic component 50 was removed by performing selective plasma etches so as to expose the spacers 30. Thereafter, a selective etch process was performed to remove the spacers 30 relative to the surrounding materials.

Figure 1E:
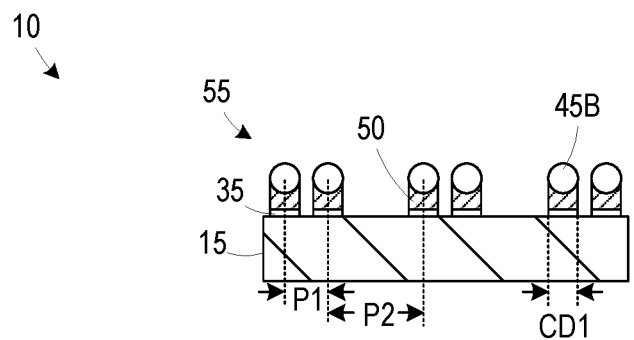

FIG. 1E illustrates the device 10 after an anisotropic etch process was performed to remove the portions of the organic component 50 and the brush layer 35 not masked by the inorganic component cylinders 45B to define a mask structure 55 (e.g., line mask elements) for patterning the process layer 15. In the depicted example, the mask structure 55 is comprised of portions of the brush layer 35, the organic component 50 and the inorganic component cylinders 45B. The mask structure 55 defines a first pitch, P1, dependent on the intrinsic pitch of the DSA material ($L_0$). A second pitch, P2, is dependent on $L_0$, the thickness of the brush layer 35 ($TH_B$), and the critical dimension of the spacer 30 ($CD_S$). A critical dimension of the inorganic component cylinders 45B, CD1, is dependent on the intrinsic CD of the inorganic component cylinders 45B of the DSA material ($CD_{DSA}$).

$$P1 = L_0$$

$$P2 = L_0 + 2Th_B + CD_S$$

$$CD1 = CD_{DSA}$$

Figure 1F:
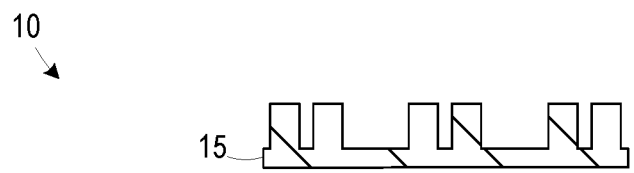

FIG. 1F illustrates the device 10 after an anisotropic etch to pattern the process layer 15 was performed through the mask structure 55, and after the mask structure 55 was removed. The various pitches illustrated in FIG. 1E may be varied by varying the dimensions of the template 20 and/or by varying the thickness of the spacer layer 25 to affect the CDs of the spacers 30. It is also possible to vary the number of elements in the mask structure 55 by varying the CD of the template 20. In general, the required template CD for a given number of elements, n, defined between the spacers 30 is determined by the equation $CD_{template} = (2n+1)L_0$.

Figure 1G:
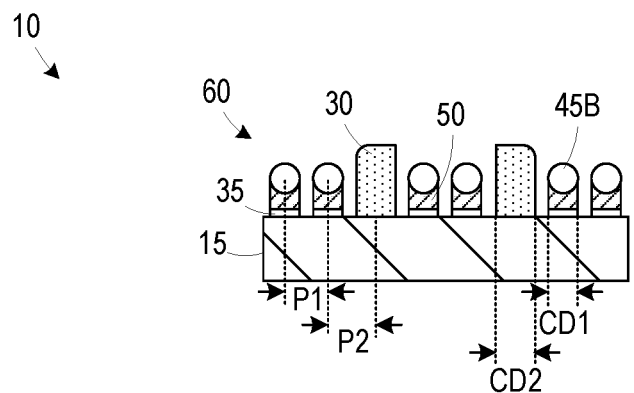

FIG. 1G illustrates an alternative embodiment, where the spacers 30 are not removed prior to the patterning of the process layer 15. The resulting mask structure 60 defines a first pitch, P1, dependent on $L_0$, a second pitch, P2, dependent on $L_0$, $Th_B$ and $CD_S$, a first critical dimension, CD1, dependent on $CD_{DSA}$ and a second critical dimension, CD2, dependent on $CD_S$. The relative values of the second pitch, P2 can be controlled to be <, = or > the first pitch, P1.

$$P1 = L_0$$

$$P2 = \frac{1}{2}L_0 + Th_B + \frac{1}{2}CD_S$$

$$CD1 = CD_{DSA}$$

$$CD2 = CD_S$$

Figure 2A:
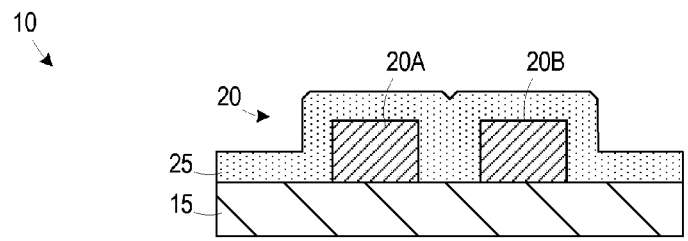
FIGS. 2A-2F are cross-sectional diagrams illustrating a method for forming a semiconductor device by patterning a process layer using a directed self-assembly material where merged spacers are employed to provide additional pitch and CD control.

FIGS. 2A-2F are cross-sectional diagrams illustrating a method for forming a semiconductor device 10 by patterning a process layer 15 using a directed self-assembly material where merged spacers are employed to provide additional pitch and CD control. FIG. 2A illustrates the device 10 including a template 20 (e.g., photoresist) including multiple elements 20A, 20B formed above the process layer 15, and a spacer layer 25 formed above the template 20. The spacing between the elements 20A, 20B and the thickness of the spacer layer 25 is such that the spacer layer 25 substantially fills the space between the elements 20A, 20B.

Figure 2B:
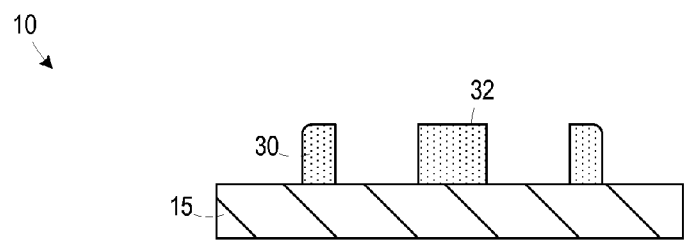

FIG. 2B illustrates the device 10 after a timed anisotropic etch process was performed on the spacer layer 25 to define spacers 30, 32 on sidewalls of the template elements 20A, 20B. Thereafter, an etching or ashing process was performed to remove the template 20. Note that the spacer 32 is a merged spacer that has a thickness dependent on the spacing between the template elements 20A, 20B.

Figure 2C:
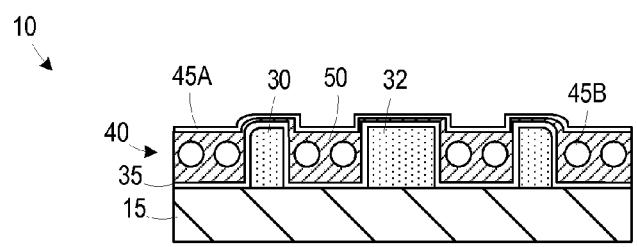

FIG. 2C illustrates the device 10 after the above-described brush layer 35 (e.g., polystyrene) is formed above the spacers 30, 32, and the above-described directed self-assembly (DSA) layer 40 including inorganic component film component 45A, inorganic component cylinders 45B, and an organic component 50 is formed above the brush layer 35.

Figure 2D:
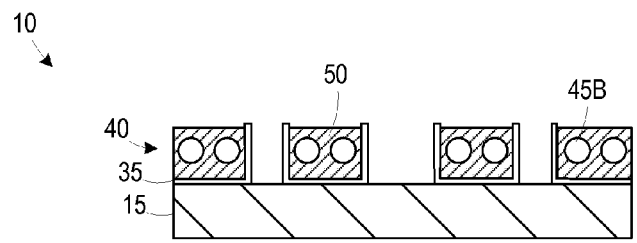
Figure 2E:
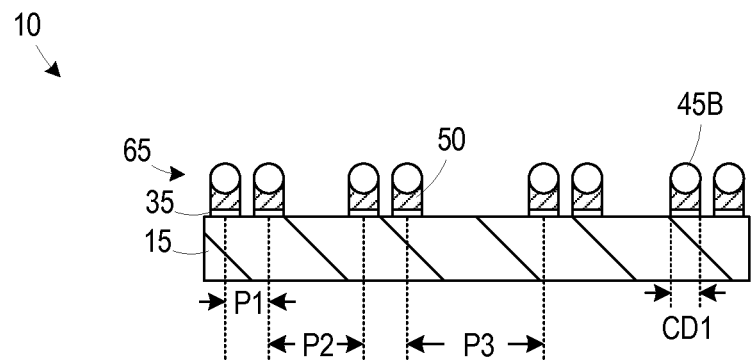

FIG. 2D illustrates the device 10 after the above-described steps to expose and selectively remove the spacers 30, 32. FIG. 2E illustrates the device 10 after an anisotropic etch process to remove the organic component 50 and the brush layer 35 not masked by the inorganic component cylinders 45B to define a mask structure 65 for patterning the process layer 15. The mask structure 65 defines a first pitch, P1, dependent on the intrinsic pitch of the DSA material ($L_0$). A second pitch, P2, is dependent on $L_0$, the thickness of the brush layer 35 ($TH_B$) and the critical dimension of the spacer 30 ($CD_S$). A third pitch, P3, is dependent on $L_0$, $TH_B$ and the critical dimension of the merged spacer 32 ($CD_{MS}$). A critical dimension, CD1, is dependent on the intrinsic CD of the inorganic component cylinders 45B of the DSA material ($CD_{DSA}$).

$P1=L_0$ $P2=L_0+2Th_B+CD_S$ $P3=L_0+2Th_B+CD_{MS}$ $CD1=CD_{DSA}$

The merged spacer CD, $CD_{MS}$ may be varied depending on the spacing between the template elements 20A, 20B such that:

$CD_S \le CD_{MS} \le 2CD_S$

An application example for the gaps defined by P2 or P3 is in the formation of a finFET device with a plurality of fins. Fins are formed beneath the elements of the mask structure 65, and no fins are formed in the gaps defined by P2 or P3.

Figure 2F:
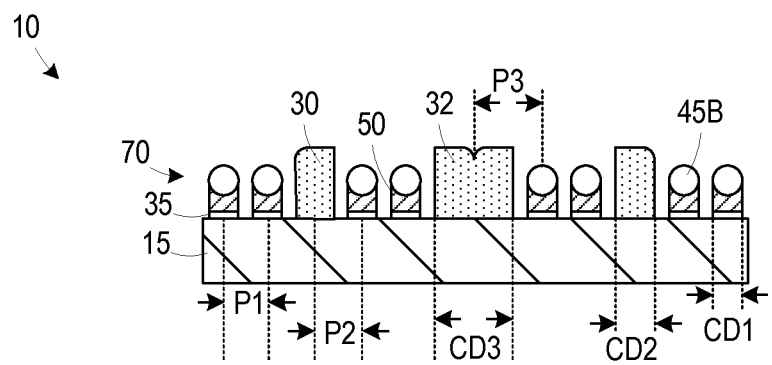

FIG. 2F illustrates an alternative embodiment, where the spacers 30, 32 are not removed prior to the patterning of the process layer 15. The resulting mask structure 70 defines a first pitch, P1, dependent on $L_0$, a second pitch, P2, dependent on $L_0$, $Th_B$ and $CD_S$, a third pitch, P3, dependent on $L_0$, $Th_B$ and $CD_{MS}$, a first critical dimension, CD1, dependent on $CD_{DSA}$, a second critical dimension, CD2, dependent on $CD_S$ and a third critical dimension, CD3, dependent on $CD_{MS}$.

$P1=L_0$ $P2=\frac{1}{2}L_0+Th_B+\frac{1}{2}CD_S$ $P3=\frac{1}{2}L_0+Th_B+\frac{1}{2}CD_{MS}$ $CD1=CD_{DSA}$ $CD2=CD_S$ $CD3=CD_{MS}$ An application example for the additional critical dimensions, CD2, CD3, is in the patterning of gate electrodes (i.e., the process layer 15 is a conductive gate electrode material or placeholder for a replacement gate electrode material), where the transistors associated with CD2 or CD3 have increased channel lengths compared to the channel lengths of transistors associated with CD1.

Figure 3A:
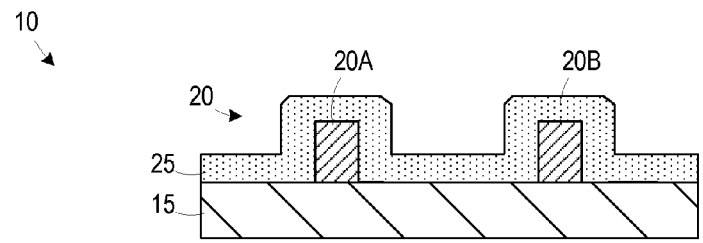
FIGS. 3A-3H are cross-sectional diagrams illustrating a method for forming a semiconductor device by patterning a process layer using a directed self-assembly material where template elements are selectively removed to provide additional pitch and CD control.
Figure 3B:
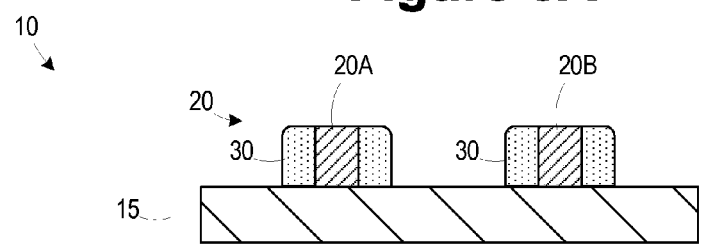

FIGS. 3A-3H are cross-sectional diagrams illustrating a method for forming a semiconductor device 10 by patterning a process layer 15 using a directed self-assembly material where template elements are selectively removed to provide additional pitch and CD control. FIG. 3A illustrates the device 10 including a template 20 (e.g., photoresist) including multiple elements 20A, 20B formed above the process layer 15, and a spacer layer 25 formed above the template 20. FIG. 3B illustrates the device 10 after a timed anisotropic etch process to pattern the spacer layer 25 to define spacers 30 on sidewalls of the template elements 20A, 20B.

Figure 3C:
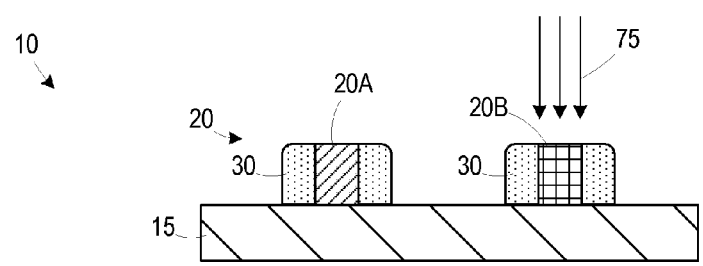
Figure 3D:
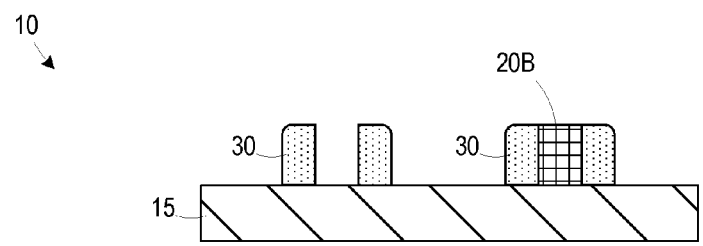

FIG. 3C illustrates the device 10 after an exposure process 75 to change the solubility of the template element 20B with respect to that of the template element 20A. FIG. 3D illustrates the device 10 after an etching or ashing process to selectively remove the template element 20A, leaving the template element 20B in place, or vice versa where the template element 20A is left instead of the template element 20B (not depicted in the Figures).

Figure 3E:
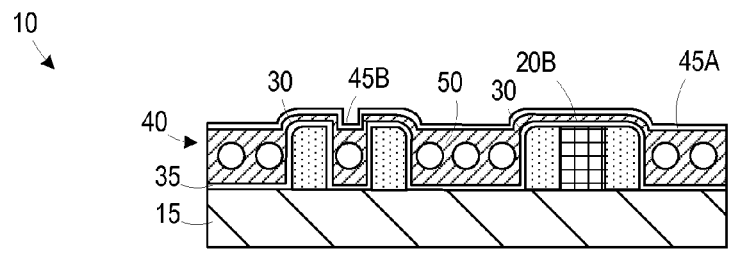

FIG. 3E illustrates the device 10 after the above-described brush layer 35 (e.g., polystyrene) is formed above the spacers 30 and the template element 20B, and the above-described directed self-assembly (DSA) layer 40 including inorganic component film component 45A, inorganic component cylinders 45B and an organic component 50 is formed above the brush layer 35.

Figure 3F:
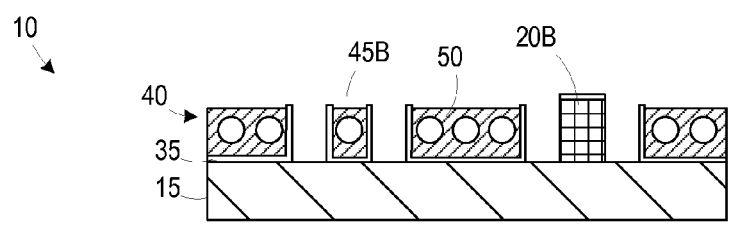
Figure 3G:
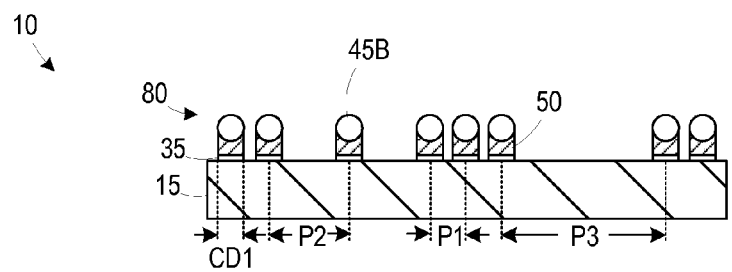

FIG. 3F illustrates the device 10 after a selective etch process to remove the spacers 30, and FIG. 3G illustrates the device 10 after an anisotropic etch process to remove the organic component 50 and the brush layer 35 not masked by the inorganic component cylinders 45B and the template element 20B to define a mask structure 80 for patterning the process layer 15. The mask structure 80 defines a first pitch, P1, dependent on the intrinsic pitch of the DSA material ($L_0$). A second pitch, P2, is dependent on $L_0$, the thickness of the brush layer 35 ($TH_B$) and the critical dimension of the spacer 30 ($CD_S$). A third pitch, P3, is dependent on $L_0$, $TH_B$, the critical dimension of the template element 20B ($CD_{TE}$) and $CD_S$. A critical dimension, CD1, is dependent on the intrinsic CD of the inorganic component cylinders 45B of the DSA material ($CD_{DSA}$).

$P1=L_0$ $P2=L_0+2Th_B+CD_S$ $P3=L_0+2Th_B+CD_{TE}+2CD_S$ $CD1=CD_{DSA}$

An application example for the gaps defined by P2 or P3 is in the formation of a finFET device with a plurality of fins. Fins are formed beneath the elements of the mask structure 80, and no fins are formed in the gaps defined by P2 or P3.

Figure 3H:
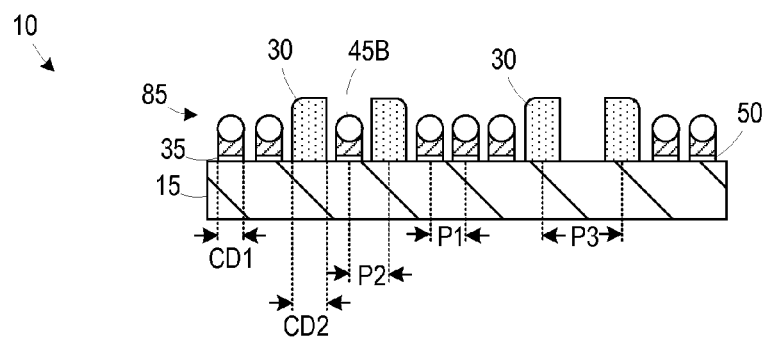

FIG. 3H illustrates an alternative embodiment, where the spacers 30 are not removed prior to the patterning of the process layer 15. The resulting mask structure 85 defines a first pitch, P1, dependent on $L_0$, a second pitch, P2, dependent on $L_0$, $Th_B$ and $CD_S$, a third pitch, P3, dependent on $CD_{TE}$ and $CD_S$, a first critical dimension, CD1, dependent on $CD_{DSA}$ and a second critical dimension, CD2, dependent on $CD_S$.

$$P1 = L_0$$

$$P2 = \tfrac{1}{2}L_0 + Th_B + \tfrac{1}{2}CD_S$$

$$P3 = CD_{TE} + CD_S$$

$$CD1 = CD_{DSA}$$

$$CD2 = CD_S$$

An application example for the gaps defined by P3 is in the formation of a finFET device with a plurality of fins. Fins are formed beneath the elements of the mask structure 85, and no fins are formed in the gaps defined by P3.

The use of sidewall image transfer in conjunction with DSA materials facilitates pitch and CD control to allow multiple pitches and CDs in a single structure. The techniques described herein also allow the fabrication of even and/or odd line/space features. In addition, the use of spacer material provides enhanced thermal stability over photoresist templates during DSA anneal processes.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a template having a plurality of elements above a process layer;
    forming spacers on sidewalls of said plurality of elements;
    removing at least a first element of said plurality of elements to expose at least a first portion of said process layer beneath said first element and between a first pair of adjacent spacers;
    forming a mask structure from a directed self-assembly material over said first exposed portion and between said first pair of adjacent spacers; and
    patterning said process layer using at least said mask structure as an etch mask.

2. The method of claim 1, further comprising removing said spacers prior to patterning said process layer.

3. The method of claim 1, wherein said process layer comprises a gate electrode material, said mask structure comprises a plurality of line elements, and patterning said gate electrode material comprises forming a first gate electrode having a first critical dimension beneath one of said line elements, and forming a second gate electrode having a second critical dimension larger than said first critical dimension beneath at least one of said spacers.

4. The method of claim 1, wherein forming said spacers comprises forming a spacer layer and etching said spacer layer to define said spacers, wherein spacers between at least two of said plurality of elements merge to define a merged spacer that remains after said etching of said spacer layer.

5. The method of claim 4, wherein said process layer comprises a gate electrode material, said mask structure comprises a plurality of line elements, and patterning said gate electrode material comprises forming a first gate electrode having a first critical dimension beneath one of said line elements, and forming a second gate electrode having a second critical dimension larger than said first critical dimension beneath said merged spacer.

6. The method of claim 4, further comprising removing said spacers and said merged spacer prior to patterning said process layer.

7. The method of claim 6, wherein said mask structure comprises a plurality of line elements, and patterning said process layer comprises patterning fins in said process layer beneath said line elements, wherein a space between at least two adjacent fins is dependent on a dimension of said merged spacer.

8. The method of claim 1, further comprising:
    leaving at least one of said plurality of elements in place prior to forming said directed self-assembly material; and
    removing said at least one of said plurality of elements prior to patterning said process layer.

9. The method of claim 8, wherein said mask structure comprises a plurality of line elements, and patterning said process layer comprises patterning fins in said process layer beneath said line elements, wherein a space between at least two adjacent fins is dependent on a dimension of said at least one of said plurality of elements.

10. The method of claim 8, further comprising exposing said at least one of said plurality of elements to a radiation to change its solubility compared to the portion of said plurality of elements removed.

11. The method of claim 8, further comprising removing said spacers prior to patterning said process layer.

12. The method of claim 1, further comprising forming a brush layer above said spacers prior to forming said directed self-assembly material.

13. The method of claim 12, wherein said brush layer comprises polystyrene.

14. The method of claim 1, wherein said directed self-assembly material comprises a cylinder forming component.

15. The method of claim 14, wherein said directed self-assembly material comprises polystyrene-block-polydimenthysiloxane.

16. The method of claim 1, wherein processing said directed self-assembly material comprises annealing said directed self-assembly material after removing at least a portion of said plurality of elements.

17. The method of claim 1, wherein forming said spacers comprises:
    forming a spacer layer above said template; and
    anisotropically etching said spacer layer to define said spacers.

18. The method of claim 1, wherein said template comprises photoresist.

19. A method, comprising:
    forming a template having a plurality of elements above a process layer;
    forming spacers on sidewalls of said plurality of elements,
    removing at least a first element of said plurality of elements to expose at least a first portion of said process layer beneath said first element and between a first pair of adjacent spacers
    forming a mask structure from a directed self-assembly material over said first portion and between said first pair of adjacent spacers; and
    patterning said process layer using said mask structure as an etch mask to define a plurality of features, wherein a pitch defined between at least two adjacent features is dependent on at least one of an intrinsic pitch of said directed self-assembly material, a dimension of at least one of said spacers or a dimension of at least one of said elements.

20. The method of claim 19, wherein a critical dimension of at least one of said features is dependent on at least one of said intrinsic pitch of said directed self-assembly material, said dimension of at least one of said spacers or said dimension of at least one of said elements.

* * * * *